United States Patent
Ito et al.

Patent Number: 5,935,374
Date of Patent: Aug. 10, 1999

[54] ELECTRONIC DEVICE FABRICATION APPARATUS

[75] Inventors: Yasuhiko Ito, Tenri; Osamu Sakai, Kitakatsuragi-gun, both of Japan

[73] Assignee: Sharp Kabushiki Kaisha, Osaka, Japan

[21] Appl. No.: 09/102,357

[22] Filed: Jun. 23, 1998

[30] Foreign Application Priority Data

Jun. 26, 1997 [JP] Japan ............................ 9-170771

[51] Int. Cl.⁶ ................... C23C 16/00; C23C 16/22
[52] U.S. Cl. ............. 156/345; 156/345; 315/111.51; 117/50; 117/92; 117/103; 117/108; 118/723 R; 216/67; 427/446; 427/488; 427/533
[58] Field of Search ................. 156/345; 315/111.51

[56] References Cited

U.S. PATENT DOCUMENTS 5,147,493  9/1992  Nishmura et al. ............... 156/345
5,325,021  6/1994  Duckworth et al. ........... 315/111.51

FOREIGN PATENT DOCUMENTS 6-5522    1/1994  Japan .
6-77144   3/1994  Japan .
7-273038  10/1995 Japan .

OTHER PUBLICATIONS

Howling et al., "Frequency Effects in Silane Plasmas for Plasma Enhanced Chemical Vapor Deposition", J. Vac. Sci. Technol. A 10(4), Jul./Aug. 1992, pp. 1080–1085.

Kitamura et al., A Computational Investiagation of the RF Plasma Structures and their Production Efficiency in the Frequency Range from HF to VHF, Plasma Sources Sci. Technol. 2(1993), pp. 40–45.

Oda, "Frequency Effects in Processing Plasmas of the VHF Band", Plasma Sources Sci. Technol. 2 (1993), pp. 26–29.

J.P. Rayner, A.D Cheetham, G.N. French, J. Vac Sci. Technol. A 14(4), Jul/Aug. 1996.

A.V. Fedotov, R.L. Gluckstern, Physical Review E, Aug. 1996, 54, 2, pp. 1930–1939.

Primary Examiner—Bruce Breneman
Assistant Examiner—Rudy Zervigon
Attorney, Agent, or Firm—Nixon & Vanderhye, PC

[57] ABSTRACT

An electronic device fabrication apparatus a reaction chamber; a cathode electrode and an anode electrode opposed to each other in the reaction chamber; a gas introduction pipe introduced into the reaction chamber for supplying reaction gas into the reaction chamber, the gas introduction pipe being electrically connected to the cathode electrode; and a high frequency power generation device for applying high frequency lower having a high exciting frequency which is included in one of a VHF band and a UHF band to the cathode electrode through the gas introduction pipe for exciting the reaction gas into a plasma state. The gas introduction pipe includes an impedance adjusting device for adjusting an impedance of the gas introduction pipe.

13 Claims, 15 Drawing Sheets

(a) Reaction chamber
(b) Gas introduction pipe (a) $C_F = 1000pF$, $L_F = 0.15\mu H$, $R = 2 ohm$
(b) $C_1 = 10pF$, $L = 0.2\mu H$, $R = 10 ohm$ (a) Reaction chamber
(b) Gas introduction pipe (a) $C_F = 1000 pF$, $L_F = 0.15 \mu H$, $R = 2 ohm$
(b) $C = 30 pF$, $L_1 = 0.02 \mu H$, $R = 10 ohm$ (a) Reaction chamber
(b) Gas introduction pipe (a) $C_F = 1000pF$, $L_F = 0.15\mu H$, R=2ohm
(b) $C = 30pF$, $L_1 = 0.005\mu H$, R=10ohm (a) Reaction chamber
(b) Gas introduction pipe (a) $C_F=1000pF$, $L_F=0.15\mu H$, $R=2ohm$
(b) $C_1=10pF$, $L_2=0.02\mu H$, $R=10ohm$, $C=30pF$, $L=0.2\mu H$ (a) Reaction chamber
(b) Gas introduction pipe (a) $C_F = 1000pF$, $L_F = 0.15\mu H$, $R = 2ohm$
(b) $C = 30pF$, $L_F = 0.2\mu H$, $R = 10ohm$, $L_3 = 0.13\mu H$ (a) Reaction chamber
(b) Gas introduction pipe (a) $C_F = 1000pF$, $L_F = 0.15\mu H$, R=2ohm
(b) C:none, $L = 0.2\mu H$, $L_4 = 1.0\mu H$, R=10ohm

PRIOR ART (a) Reaction chamber
(b) Gas introduction pipe (a) $C_F = 1000pF$, $L_F = 0.15\mu H$, $R = 2ohm$
(b) $C = 30pF$, $L = 0.2\mu H$, $R = 10ohm$

*PRIOR ART*

ELECTRONIC DEVICE FABRICATION APPARATUS

BACKGROUND OF THE INVENTION

1. Field of the Invention

The present invention relates to an electronic device fabrication apparatus which is specifically suitable as a plasma chemical vapor deposition apparatus usable for forming a semiconductor thin film formed of amorphous silicon hydride and an insulative film, or suitable as a plasma etching apparatus usable for processing a semiconductor device, a liquid crystal device and the like. In this specification, plasma chemical vapor deposition will be referred to as "plasma CVD", and amorphous silicon hydride will be referred to as "a-Si:H".

2. Description of the Related Art

Today, electronic device fabrication apparatuses, such as, for example, plasma CVD apparatuses and plasma etching apparatuses are in wide use for fabricating metal films, semiconductor films, dielectric films and crystal-line wafers.

An exciting frequency of a high frequency power supply for generating plasma used in most of such electronic device fabrication apparatuses is of a radiowave (frequency: around 13.56 MHz; also referred to as "RF" or high frequency "HF") or of a microwave (frequency: around 2.45 GHz; also referred to as "MW").

Recent active studies in plasma physics have found theoretically, as well as based on experiments, that an intermediate frequency band between the radioactive wave frequency band and the microwave frequency band is suitable for use in fabrication of electronic devices. The intermediate frequency band includes a band of around 100 MHz which is referred to as the "VHF" (very high frequency) band and a band around several hundred mega-hertz which is referred to as the "UHF" (ultra high frequency) band.

A. A. Howling, et al., "J. Vac. Sci. Technol. A10 (1992), page 1080", for example, describes dependency of $SiH_4$ plasma on frequency in the case where the VHF band is used for an exciting frequency. T. Kitamura et al., "Plasma Sources Sci. Technol. 2 (1993), pp. 40–45" and "S. Oda, Plasma Sources Sci. Technol. 2 (1993), pp. 26–29", for example, describe effects of using the VHF band for an exciting frequency.

Japanese Laid-Open Publication No. 6-77144 describes a usable high frequency range, and Japanese Laid-Open Publication No. 6-5522 describes the use of high frequency power which is permitted by altering the surface structure of a cathode electrode. Japanese Laid-Open Publication No. 7-273038 describes insertion of an insulative pipe in an intermediate portion of a gas introduction pipe which is used for introducing gas into a reaction chamber. The above-mentioned publication also describes a technology regarding the position and the inner diameter of the insulative pipe.

FIG. 14 is a schematic view of a conventional plasma CVD apparatus 700. The conventional plasma CVD apparatus 700 includes a reaction chamber 5. The reaction chamber 5 accommodates a cathode electrode 2 and an anode electrode 4 which are opposed to each other. The anode electrode 4 has a substrate 6 provided on a surface thereof which faces the cathode electrode 2. The reaction chamber 5 further accommodates a heater 7 provided on a rear wall 5b thereof.

Reaction gas 8 is introduced into the reaction chamber 5 through a gas introduction pipe 1. One end 1a of the gas introduction pipe 1 is connected to the cathode electrode 2. The reaction gas 8 is blown into the reaction chamber 5 through a gas ejection hole (not shown) formed in the cathode electrode 2. The gas introduction pipe 1 has an insulative pipe 10 in an intermediate portion thereof. A high frequency power generation device 3, including a high frequency power supply 3a and a matching circuit 3b, is provided in the vicinity of the end 1a of the gas introduction pipe 1.

Use of an intermediate region between the RF and the MW as an exciting frequency of the high frequency power supply 3a is advantageous for (1) increasing the plasma density in proportion to the square of the frequency and (2) realizing such a high plasma density by a relatively low potential.

Advantage (1) above refers to the fact that the film deposition rate increases in proportion to the square of the frequency in the case where the intermediate region is used for film deposition, and refers to the fact that the etching rate increases in proportion to the square of the frequency in the case where the intermediate region is used for etching. Accordingly, the fabrication efficiency of electronic devices is enhanced.

Advantage (2) above restricts plasma damage, i.e., damage on the film or substrate caused by ions contained in the plasma even during the high rate film formation or etching.

FIG. 15 is a graph illustrating impedances in the reaction chamber 5 and the gas introduction pipe 1 with respect to the frequency in the plasma CVD apparatus 700. When only a voltage having a frequency in the RF band is used for generating plasma, impedance |Z| between the cathode electrode 2 and the anode electrode 4 in the reaction chamber 5 is about 10 to 20 Ω, whereas impedance |Z| in the gas introduction pipe 1 is as high as about 300 Ω. Accordingly, very little high frequency power is supplied to the gas introduction pipe 1, which permits electric discharge to occur in the reaction chamber 5.

In an electronic industry which is referred to as giant microelectronics, such as solar cells and liquid crystal display devices using thin films formed of a-Si:H-type materials, substrates have a relatively great length of, for example, about 40 to 60 cm. In order to realize a high throughput, a reaction chamber for processing a plurality of such large substrates at one time is required. For a semiconductor device fabrication apparatus, for example, it is very important that a plurality of substrates should be processed at one time in order to realize a high throughput.

For the above-described reasons, a reaction chamber unavoidably has a side of as great as about 1 meter. More specifically, surfaces of the cathode electrode and the anode electrode which face each other, i.e., electrode surfaces need to be increased. The size of the electrode surfaces is in the same order as that of the wavelength of the VHF band.

Therefore, in order to realize a high throughput, it is necessary to use a frequency in the VHF or UHF band, which corresponds to the size of the fabrication apparatus (i.e., size of the reaction space between the cathode electrode and the anode electrode) as an exciting frequency supplied from the high frequency power supply. With the prior art described in Japanese Laid-Open Publication No. 6-77144, 6-5522 and 7-273038, the following problems (1) and (2) occur. Due to such problems, utilization of plasma generated in the reaction space over a large surface area is prevented.

(1) The increase in size of the cathode electrode and the anode electrode increases the floating capacitance, which raises the impedance between the cathode electrode and the anode electrode, i.e., the impedance in the reaction chamber.

Especially in the plasma CVD apparatus 700 (FIG. 14) described in Japanese Laid-Open Publication No. 7-273038, in which the insulative pipe 10 is provided in an intermediate portion of the gas introduction pipe 1, when high frequency power in the VHF band is supplied, the insulative pipe 10 has a capacitance. The capacitance causes resonance, and as a result, impedance |Z| in the gas introduction pipe 1 becomes smaller than impedance |Z| in the reaction chamber 5.

As a consequence, the high frequency power is absorbed by the insulative pipe 10 in the gas introduction pipe 1, and the insulative pipe 10 is heated excessively. Therefore, the amount of power introduced to the reaction chamber 5 is reduced, thus preventing electric discharge between the cathode electrode 2 and the anode electrode 4.

Moreover, such a phenomenon can disadvantageously melt and destroy the insulative pipe 10 and thus cause safety problems.

(2) In the case when the high frequency power is absorbed in the insulative pipe 10 in the gas introduction pipe 1 as described above, electrolytic dissociation of the reaction gas can disadvantageously occur; i.e., the reaction gas is disadvantageously converted into a plasma state.

When gas used for film formation or dry etching is electrolytically dissociated before being introduced to the reaction chamber, the film formation or etching is not performed. Furthermore, generation of plasma is not performed in the reaction chamber. For example, when $SiH_4$ gas, which is used for forming a silicon film in the reaction chamber, is electrolytically dissociated before being introduced into the reaction chamber, silicon loses its reaction activity and enters the reaction chamber in a microscopic powder state. Silicon in such a state causes, for example, deterioration in film quality and particle contamination.

Accordingly, the gas introduction pipe is preferably structured to prevent the electrolytic dissociation.

SUMMARY OF THE INVENTION

An electronic device fabrication apparatus according to the present invention includes a reaction chamber; a cathode electrode and an anode electrode opposed to each other in the reaction chamber; a gas introduction pipe introduced into the reaction chamber for supplying reaction gas into the reaction chamber, the gas introduction pipe being electrically connected to the cathode electrode; and a high frequency power generation device for applying a high frequency voltage having a high exciting frequency which is included in one of a VHF band and a UHF band to the cathode electrode through the gas introduction pipe for exciting the reaction gas into a plasma state. The gas introduction pipe includes an impedance adjusting device for adjusting an impedance of the gas introduction pipe.

In one embodiment of the invention, the impedance adjusting device adjusts the impedance of the gas introduction pipe to be higher than an impedance of the reaction chamber.

In one embodiment of the invention, the impedance adjusting device includes an insulative pipe having an adjustable length which is provided in an intermediate portion of the gas introduction pipe as a part of the gas introduction pipe, and a capacitance C which is variable by adjusting the length of the insulative pipe is an impedance adjusting capacitance $C_1$.

In one embodiment of the invention, the impedance adjusting capacitance $C_1$ fulfills expression (1):

$$|(2\pi \cdot f)L_F - 1/(2\pi \cdot f)C_F| < |(2\pi \cdot f)L - 1/(2\pi \cdot f)C_1| \qquad (1)$$

where:
π: ratio of the circumference of the circle to the diameter,
f: exciting frequency,
$L_F$: inductance at a position which is electrically connected in series to a portion having the same potential as that of the cathode electrode for a DC voltage,
$C_F$: capacitance between a portion having the same potential as that of the cathode electrode for a DC voltage and a portion having a ground potential, and
L: inductance at a position which is electrically connected in series to the insulative pipe in the gas introduction pipe.

In one embodiment of the invention, the gas introduction pipe has an insulative pipe in an intermediate portion thereof, the impedance adjusting device includes another portion provided in the gas introduction pipe in serial connection with the insulative pipe, and the another portion has an adjustable length and has an impedance adjusting inductance $L_1$.

In one embodiment of the invention, the inductance impedance adjusting inductance $L_1$ fulfills expression (2):

$$|(2\pi \cdot f)L_F - 1/(2\pi \cdot f)C_F| < |(2\pi \cdot f)L_1 - 1/(2\pi \cdot f)C| \qquad (2)$$

where:
π: ratio of the circumference of the circle to the diameter,
f: exciting frequency,
$L_F$: inductance at a position which is electrically connected in series to a portion having the same potential as that of the cathode electrode for a DC voltage,
$C_F$: capacitance between a portion having the same potential as that of the cathode electrode for a DC voltage and a portion having a ground potential, and
C: capacitance between the insulative pipe and the portion having the ground potential.

In one embodiment of the invention, the gas introduction pipe has an insulative pipe in an intermediate portion thereof, the impedance adjusting device includes another portion provided in the gas introduction pipe in serial connection with the insulative pipe, and the another portion has an impedance adjusting inductance $L_2$ and connected in parallel to the gas introduction pipe.

In one embodiment of the invention, the inductance impedance adjusting inductance $L_2$ fulfills expression (3):

$$|(2\pi \cdot f)L_F - 1/(2\pi \cdot f)C_F| < |(2\pi \cdot f)(1/(1/L + 1/L_2)) - 1/(2\pi \cdot f)C| \qquad (3)$$

where:
π: ratio of the circumference of the circle to the diameter,
f: exciting frequency,
$L_F$: inductance at a position which is electrically connected in series to a portion having the same potential as that of the cathode electrode for a DC voltage,
$C_F$: capacitance between a portion having the same potential as that of the cathode electrode for a DC voltage and a portion having a ground potential,
L: inductance at a position which is electrically connected in series to the insulative pipe in the gas introduction pipe, and
C: capacitance between the insulative pipe and the portion having the ground potential.

In one embodiment of the invention, the gas introduction pipe has an insulative pipe in an intermediate portion thereof, and the impedance adjusting device includes a groove structure provided on an inner surface of the insulative pipe.

In one embodiment of the invention, the gas introduction pipe has an insulative pipe in an intermediate portion thereof, and the impedance adjusting device includes another portion having an inductance $L_3$ which is connected to the insulative pipe in parallel.

In one embodiment of the invention, the inductance impedance adjusting inductance $L_3$ fulfills expression (4):

$$|(2\pi f)L_F - 1/(2\pi f)C_F| < |1/((2\pi f)C - 1/(2\pi f)L_3)| \quad (4)$$

where:

π: ratio of the circumference of the circle to the diameter,
f: exciting frequency,
$L_F$: inductance at a position which is electrically connected in series to a portion having the same potential as that of the cathode electrode for a DC voltage,
$C_F$: capacitance between a portion having the same potential as that of the cathode electrode for a DC voltage and a portion having a ground potential, and
C: capacitance between the insulative pipe and the portion having the ground potential.

In one embodiment of the invention, the impedance adjusting device includes a coil having an inductance $L_4$ provided in an intermediate portion of the gas introduction pipe.

In one embodiment of the invention, the inductance impedance adjusting inductance $L_4$ fulfills expression (5):

$$|(2\pi f)L_F - 1/(2\pi f)C_F| < |(2\pi f)(L + L_4)| \quad (5)$$

where:

π: ratio of the circumference of the circle to the diameter,
f: exciting frequency,
$L_F$: inductance at a position which is electrically connected in series to a portion having the same potential as that of the cathode electrode for a DC voltage,
$C_F$: capacitance between a portion having the same potential as that of the cathode electrode for a DC voltage and a portion having a ground potential, and
L: inductance of a portion of the gas introduction pipe other than the coil, the portion being provided at a position connected to the coil having an inductance $L_4$ in series between a position having the same potential as that of the cathode electrode for a DC voltage and the position having the ground potential.

Thus, the invention described herein makes possible the advantage of providing an electronic device fabrication apparatus which permits large-area utilization of plasma generated at an exciting frequency in the VHF or UHF band and thus is suitable as a plasma CVD apparatus or a plasma etching apparatus providing a high throughput.

This and other advantages of the present invention will become apparent to those skilled in the art upon reading and understanding the following detailed description with reference to the accompanying figures.

DESCRIPTION OF THE PREFERRED EMBODIMENTS

Hereinafter, the present invention will be described by way of illustrative examples with reference to the accompanying drawings.

As used throughout the specification, the VHF band refers to a frequency band of several ten to several hundred megahertz exceeding the RF band (13.56 MHz), and the UHF band refers to a frequency band of several hundred to several tens of hundred megahertz.

Figure 1:
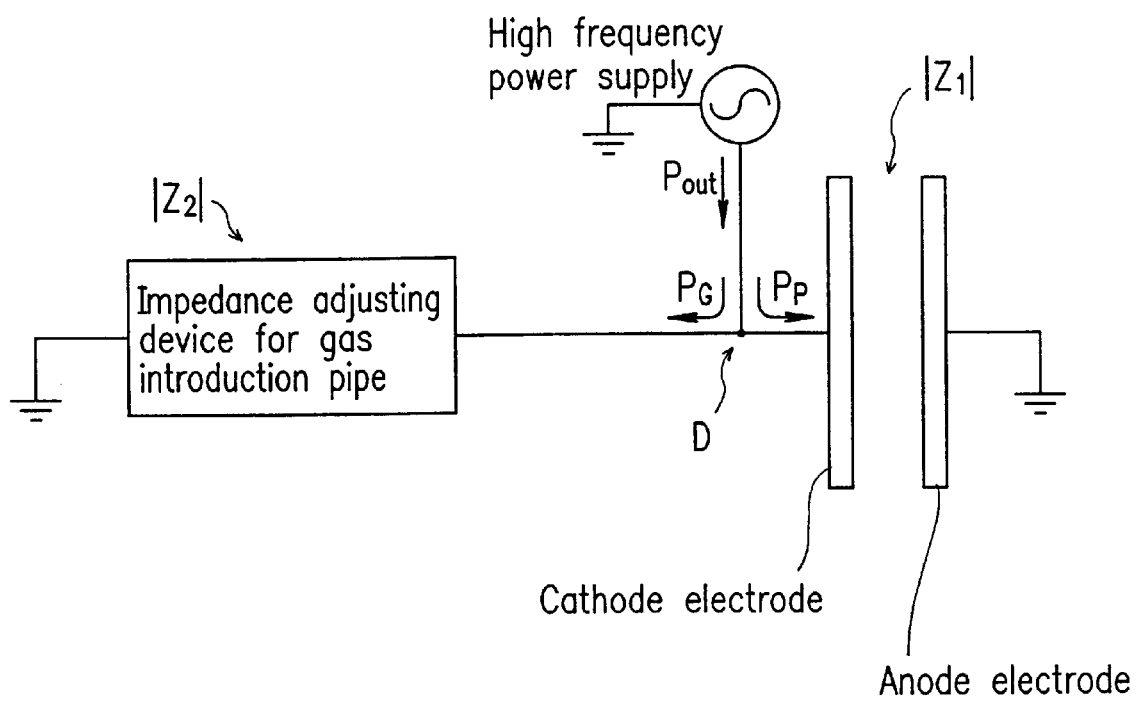
FIG. 1 is a schematic circuit diagram illustrating the concept of the present invention.

With reference to FIG. 1, the concept of the present invention will be described.

According to the present invention, the ratio between an amount $P_G$ and an amount $P_P$ of high frequency power $P_{OUT}$, having an exciting frequency f in the VHF band or the UHF band provided by the high frequency power supply, is adjusted. The amount $P_G$ flows to the ground via an impedance adjusting device, and the amount $P_P$ flows to a cathode electrode. The ratio is determined by the relationship between impedance $|Z_2|$, regarding the amount $P_G$, in a gas introduction pipe and impedance $|Z_1|$, regarding the amount $P_P$, in a reaction chamber. In this specification, an impedance caused by a path between branching point D and the cathode electrode (the path corresponding to a part of the gas introduction pipe) is ignored because this impedance is significantly small compared to impedances $|Z_2|$ and $|Z_1|$. It is possible to provide another impedance adjusting device in the path so as to adjust a high frequency voltage applied to the cathode electrode.

In the following examples, the impedance adjusting device is adjusted so that impedance $|Z_2|$ in the gas introduction pipe is greater than impedance $|Z_1|$ in the reaction chamber when the high frequency power is supplied. Such an adjustment allows the high frequency voltage having a frequency in the VHF or UHF band to be applied to the cathode electrode at a sufficient level to generate plasma.

In the following example, identical elements previously discussed with respect to FIG. 14 bear identical reference numerals and the descriptions thereof will be omitted.

EXAMPLE 1

In a first example according to the present invention, a plasma CVD apparatus 100 to which the present invention is applied will be described.

Figure 2:
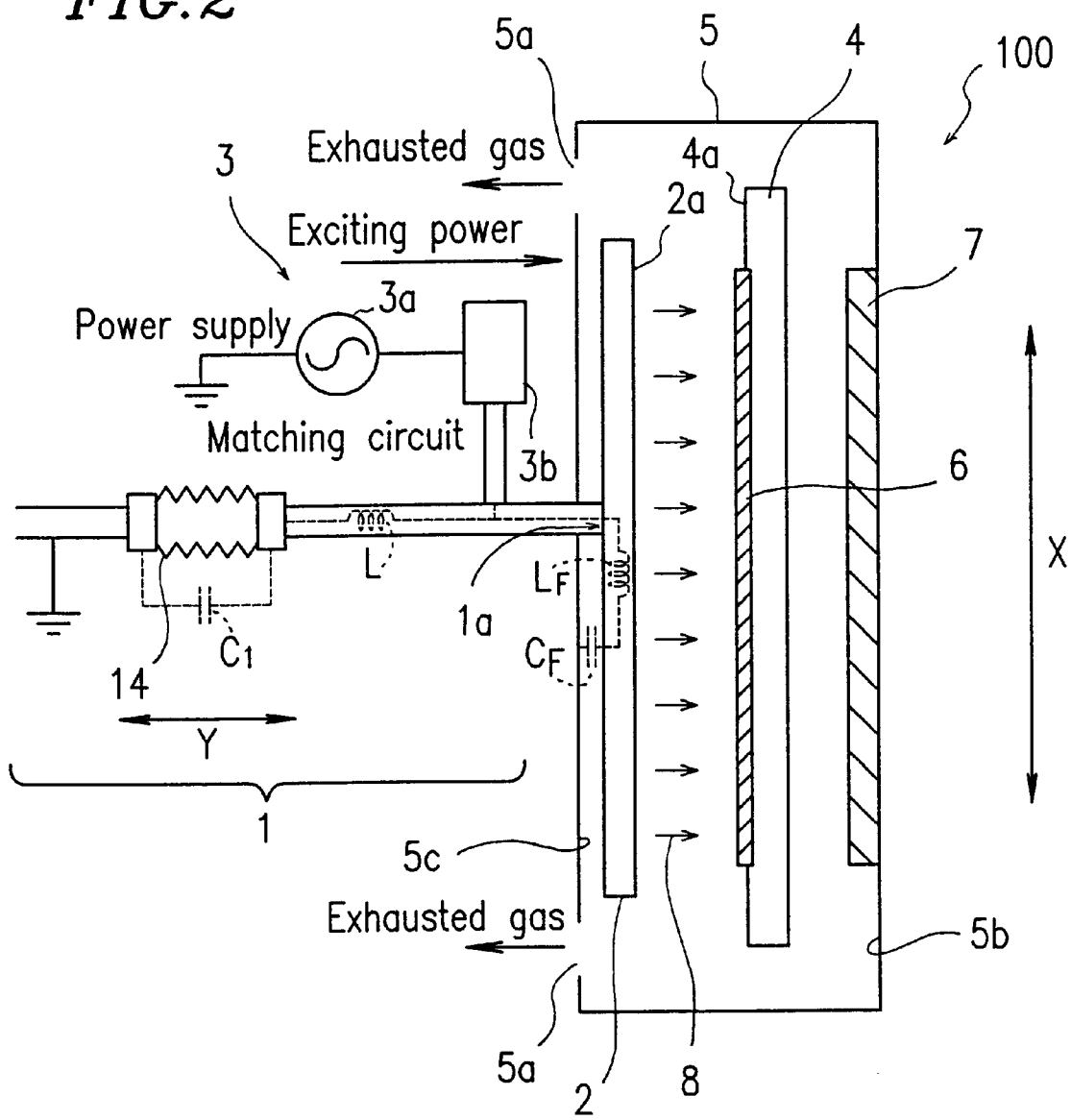
FIG. 2 is a schematic view of a plasma CVD apparatus in a first example according to the present invention.

As shown in FIG. 2, the plasma CVD apparatus 100 includes a reaction chamber 5 having rectangular side surfaces longer in an X direction than in a Y direction, a gas introduction pipe 1 provided outside the reaction chamber 5 for introducing reaction gas into the reaction chamber 5, and a high frequency power generation device 3 connected to the gas introduction pipe 1.

The reaction chamber 5 accommodates an internal type square cathode electrode 2 having, for example, 700 mm long sides and a square anode electrode 4 having, for example, 750 mm long sides which are opposed to each other. The cathode electrode 2 and the anode electrode 4 are apart from each other by an appropriate gap in a Y direction. In this example, the gap is 2.5 cm. The cathode electrode 2 is electrically connected to a wall of the reaction chamber 5 and has a ground potential. A substrate 6 is provided on a surface 4a of the anode electrode 4 which faces the cathode electrode 2, i.e., an electrode surface of the anode electrode 4. A heater 7 is provided on a rear wall 5b of the reaction chamber 5. The reaction chamber 5 has discharge outlets 5a at a top end and a bottom end of a front wall 5c of the reaction chamber 5.

One end 1a of the gas introduction pipe 1 is electrically connected to the cathode electrode 2 and another end (not shown) of the gas introduction pipe 1 is connected to a gas source (not shown). The gas introduction pipe 1 has an insulative pipe 14 in an intermediate portion thereof. The insulative pipe 14 is bellow-like and is formed of polytetrafluoroethylene (e.g., Teflon®) having a dielectric constant of about 3.0. The insulative pipe 14 acts as an impedance adjusting device, and the size thereof in a Y direction (i.e., length) is adjustable. The rest of the gas introduction pipe 1 is formed of stainless steel.

A surface 2a of the cathode electrode 2 which faces the anode electrode 4, i.e., an electrode surface of the cathode electrode 2 has a plurality of through-holes (not shown). The reaction gas 8 flowing in the gas introduction pipe 1 is introduced through the through-holes to a reaction space between the cathode electrode 2 and the anode electrode 4.

The high frequency power generation device 3 includes a high frequency power supply 3a and a matching circuit 3b. The matching circuit 3b is electrically connected to the gas introduction pipe 1 in series. In the plasma CVD apparatus 100, the exciting frequency f for generating plasma is set to be 54.24 MHz, which is in the VHF band. The matching circuit 3b is provided for adjusting an input impedance.

In the plasma CVD apparatus 100, impedance $|Z_1|$ in the reaction chamber 5 is expressed as $|Z_1|=|(2\pi\cdot f)L_F-1/(2\pi\cdot f)C_F|$, and impedance $|Z_2|$ in the gas introduction pipe 1 is expressed as $|Z_2|=|(2\pi\cdot f)L-1/(2\pi\cdot f)C_1|$, where:

π: ratio of the circumference of the circle to the diameter, f: exciting frequency, $L_F$: inductance at a position which is electrically connected in series to a portion having the same potential as that of the cathode electrode 2 for a DC voltage, $C_F$: capacitance between a portion having the same potential as that of the cathode electrode 2 for a DC voltage and a portion having a ground potential, L: inductance at a position which is electrically connected in series to the insulative pipe 14 in the gas introduction pipe, and $C_1$: capacitance of the insulative pipe 14.

Inductances $L_F$ and L and capacitances $C_F$ and $C_1$ are schematically shown in FIG. 2.

The length of the insulative pipe 14 is adjusted so that impedance $|Z_2|$ in the gas introduction pipe 1 is greater than impedance $|Z_1|$ in the reaction chamber 5, i.e., $|Z_1|<|Z_2|$. More specifically, the length of the insulative pipe 14 is adjusted so as to fulfill expression (1), so that capacitance $C_1$ of the insulative pipe 14 acts as an impedance adjusting capacitance.

$$|(2\pi\cdot f)L_F-1/(2\pi\cdot f)C_F|<|(2\pi\cdot f)L-1/(2\pi\cdot f)C_1| \qquad (1)$$

Figure 3:
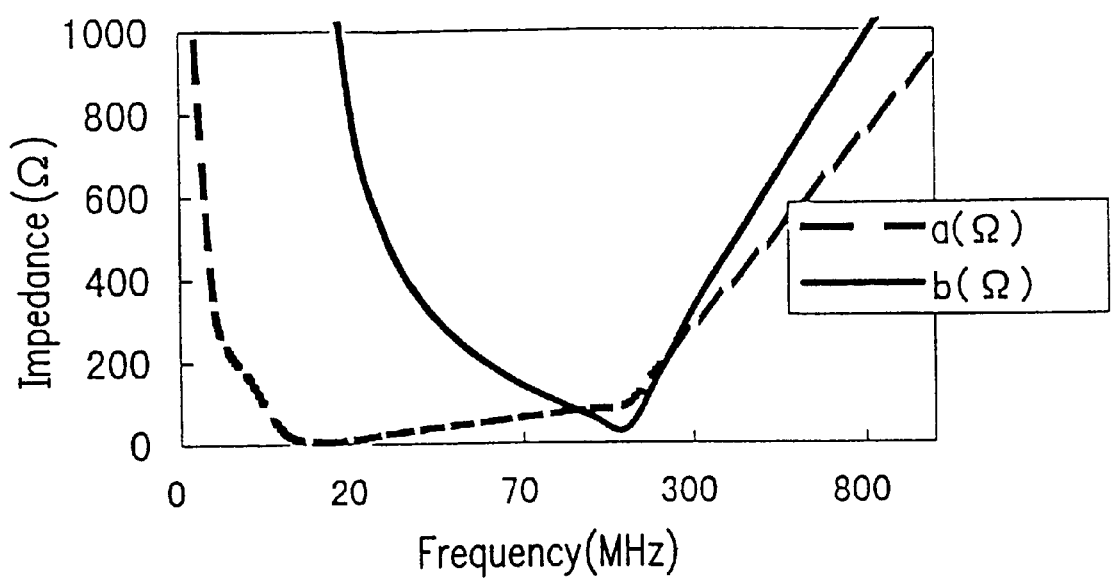
FIG. 3 is a graph illustrating impedances in a reaction chamber and a gas introduction pipe with respect to the frequency in the plasma CVD apparatus shown in FIG. 2.

More specifically, the exciting frequency f for generating plasma is 54.24 MHz which is in the VHF band. The insulative pipe 14 is adjusted to change capacitance $C_1$ from 30 pF (conventional value; see FIG. 15) to 10 pF. Assuming that inductance L in the gas introduction pipe 1, which is equivalent to the change in capacitance $C_1$, is 0.2 μH, the values of $C_F$, $L_F$ and $C_1$ in FIG. 3 are substituted into expression (1). As a result, $|Z_1|=|(2\pi\cdot f)L_F-1/(2\pi\cdot f)C_F|=40$ Ω (reaction chamber 5), and $|Z_2|=|(2\pi\cdot f)L-1/(2\pi\cdot f)C_1|=250$ Ω (gas introduction pipe 1). Thus, it is confirmed that plasma is generated in the reaction chamber 5 at a frequency of up to about 80 MHz, which is in the VHF band which exceeds the RF band, as illustrated in FIG. 3.

As described above, the plasma CVD apparatus 100 allows the impedance in the gas introduction pipe 1 to be adjusted to be greater than the impedance in the reaction chamber 5 with relative ease. Accordingly, plasma which is generated using an exciting frequency in the VHF or UHF band is utilized over a large area in the reaction space, and thus a sufficiently high throughput is achieved.

EXAMPLE 2

In a second example according to the present invention, a plasma CVD apparatus 200 to which the present invention is applied will be described.

Figure 4:
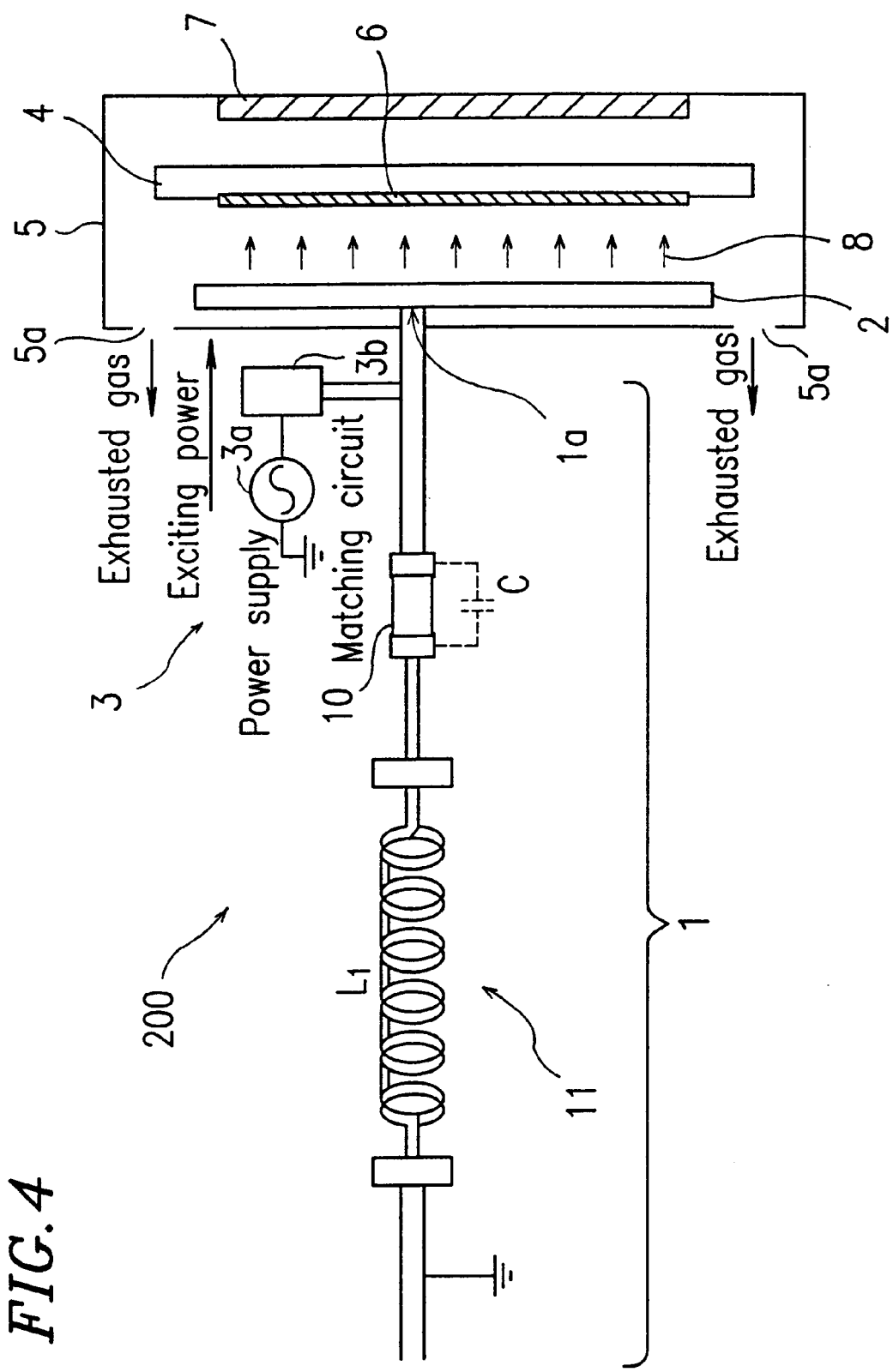
FIG. 4 is a schematic view of a plasma CVD apparatus in a second example according to the present invention.

As shown in FIG. 4, the plasma CVD apparatus 200 includes a coil pipe 11 in an intermediate portion of the gas introduction pipe 1. The coil pipe 11 has a variable length and thus acts as an impedance adjusting device. The length of the insulative pipe 10 is not variable. The coil pipe 11 is connected to the insulative pipe 10 in series. Except for these points, the plasma CVD apparatus 200 has substantially the same structure with that of the plasma CVD apparatus 100. The insulative pipe 10 has capacitance C of 30 pF.

Figure 14:
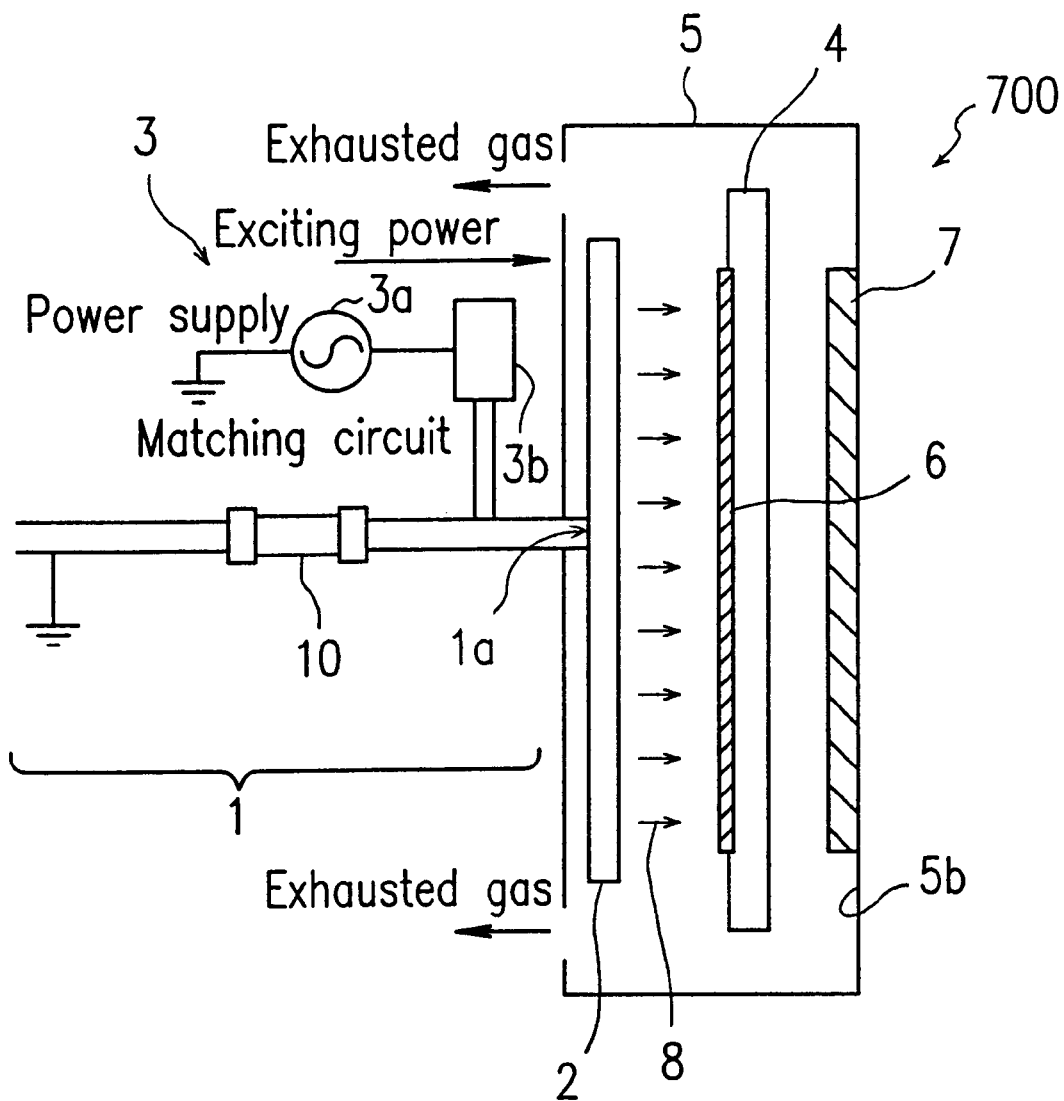
FIG. 14 is a schematic view of a conventional plasma CVD apparatus.
Figure 15:
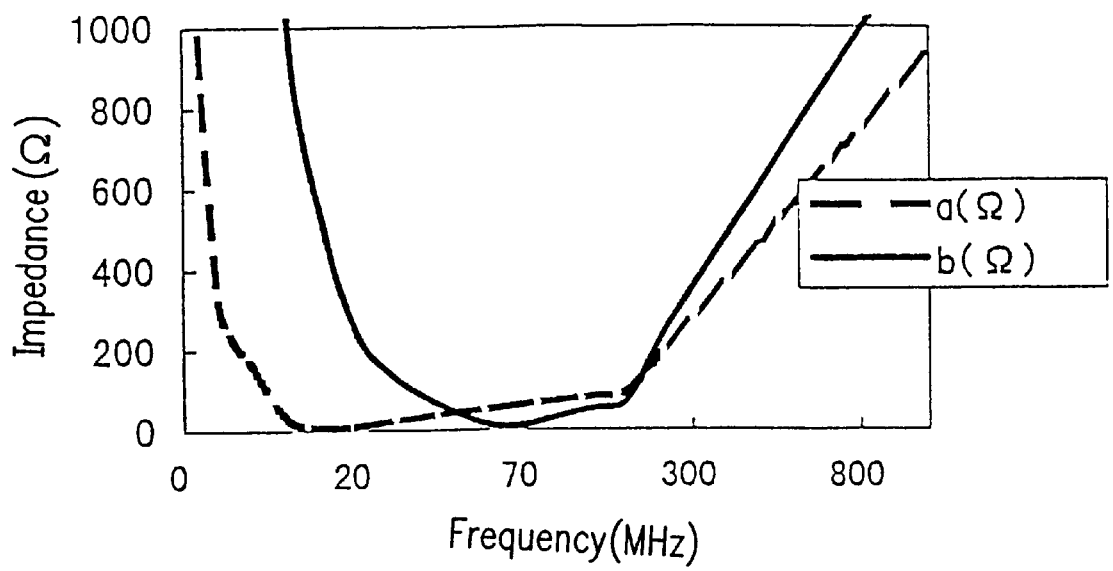
FIG. 15 is a graph illustrating impedances in a reaction chamber and a gas introduction pipe with respect to the frequency in the conventional plasma CVD apparatus shown in FIG. 14.

Referring to FIG. 15 regarding the conventional plasma CVD apparatus 700 shown in FIG. 14, the impedance in the reaction chamber 5 is significantly lower than the impedance in the gas introduction pipe 1 in the RF band (around 10 MHz). In contrast, in the VHF band (for example, 50 to 60 MHz), the impedance in the reaction chamber 5 is higher than the impedance in the gas introduction pipe 1. Accordingly, when high frequency power having a frequency in the VHF band is introduced from the high frequency power supply 3a, the power is supplied to the gas introduction pipe 1. Therefore, plasma is not generated in the reaction chamber 5.

In the plasma CVD apparatus 200 in the second example, the Length of the coil pipe 11 is varied to adjust inductance $L_1$ of the gas introduction pipe 1, so that impedance $|Z_2|$ in the gas introduction pipe 1 is greater than impedance $|Z_1|$ in the reaction chamber 5.

Impedance $|Z_1|$ in the reaction chamber 5 is expressed as $|Z_1|=|(2\pi \cdot f)L_F-1/(2\pi \cdot f)C_F|$, and impedance $|Z_2|$ in the gas introduction pipe 1 is expressed as $|Z_2|=|(2\pi \cdot f)L_1-1/(2\pi \cdot f)C|$, where C is capacitance between the insulative pipe and a portion having a ground potential. Capacitance C is schematically shown in FIG. 4. Inductance $L_1$ is adjusted so as to fulfill expression (2).

$$|(2\pi \cdot f)L_F-1/(2\pi \cdot f)\ C_F|<|(2\pi \cdot f)\ L_1-1/(2\pi \cdot f)C| \quad (2)$$

Figure 5:
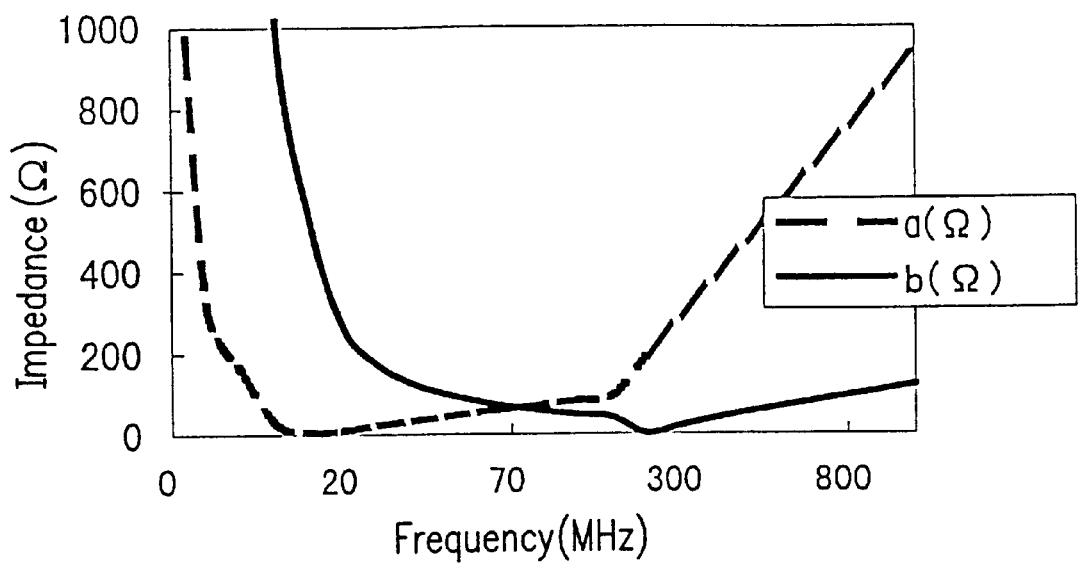
FIGS. 5 and 6 are graphs illustrating impedances in a reaction chamber and a gas introduction pipe with respect to the frequency in the plasma CVD apparatus shown in FIG. 4.
Figure 6:
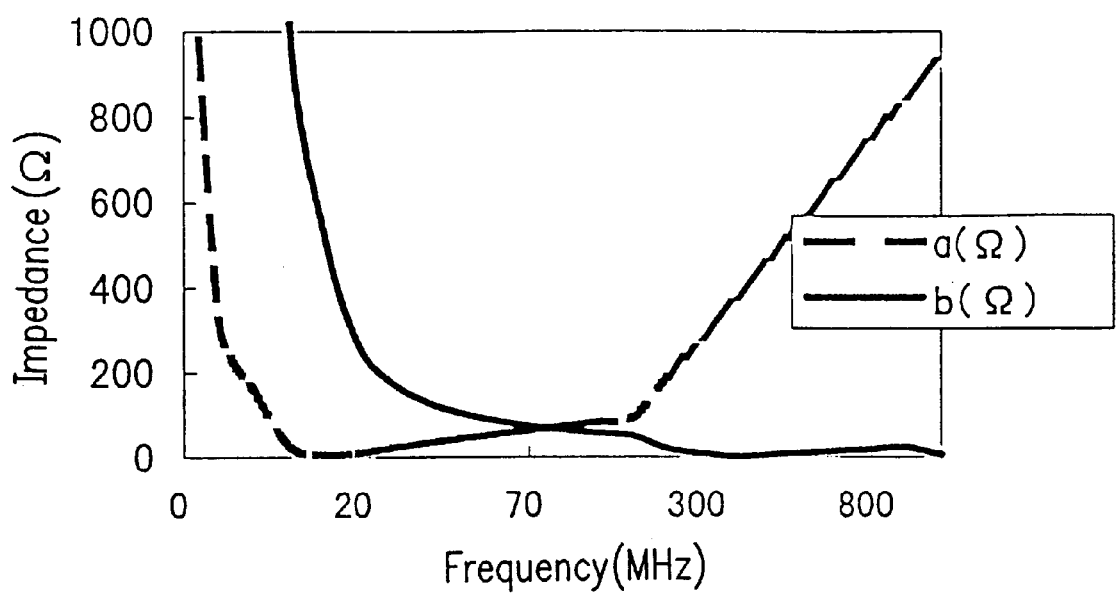

More specifically, inductance $L_1$ is set to be, for example, 0.02 $\mu$H (FIG. 5) or 0.005 $\mu$H (FIG. 6), so that impedance $|Z_2|$ in the gas introduction pipe 1 is greater than impedance $|Z_1|$ in the reaction chamber 5. The exciting frequency f for generating plasma is 54.24 MHz, which is in the VHF band. The values of $C_F$, $L_F$, and C in FIG. 5 or 6 are substituted into expression (2). As a result, impedance $|Z_2|$ in the gas introduction pipe 2 is 100 $\Omega$ when inductance $L_1$ is 0.02 $\mu$H, and 105 $\Omega$ when inductance $L_1$ is 0.005 $\mu$H, whereas, impedance $|Z_1|$ in the reaction chamber 5 is about 40 $\Omega$.

In either case, impedance $|Z_2|$ in the gas introduction pipe 1 is greater than impedance $|Z_1|$ in the reaction chamber 5. Thus, the plasma CVD apparatus 200 provides the same effect as that of the plasma CVD apparatus 100 in the first example.

EXAMPLE 3

In a third example according to the present invention, a plasma CVD apparatus 300 to which the present invention is applied will be described.

Figure 7:
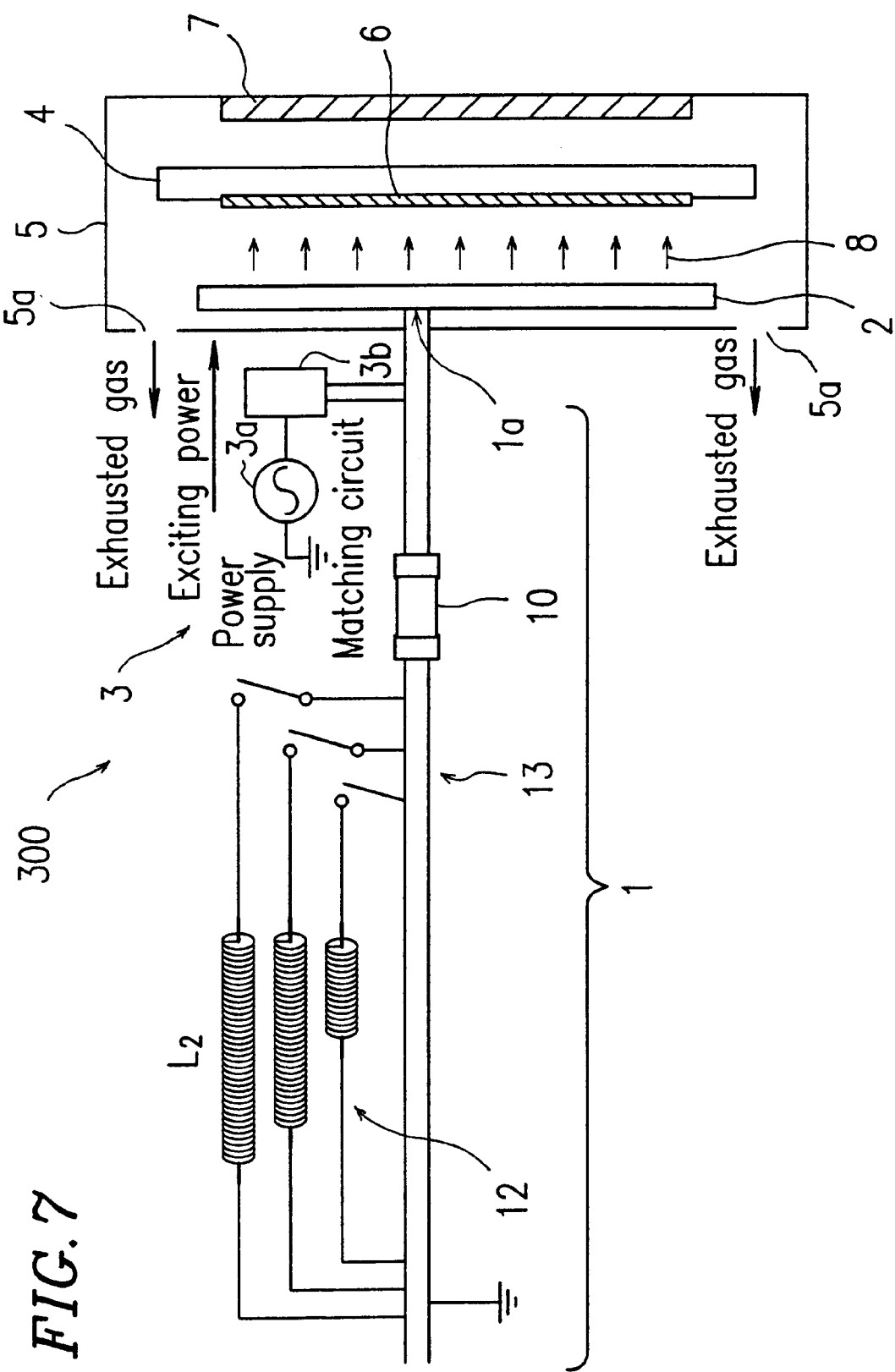
FIG. 7 is a schematic view of a plasma CVD apparatus in a third example according to the present invention.

As shown in FIG. 7, the plasma CVD apparatus 300 includes a coil set 12 acting as an impedance adjusting device. The coil set 12 includes a plurality of coils (three in FIG. 7) connected in parallel, each having a switch 13. The length of the insulative pipe 10 is not variable. Except for these points, the plasma CVD apparatus 300 has the substantially the same structure as that of the plasma CVD apparatus 100 in the first example.

In the plasma CVD apparatus 300, the switches 13 of the coil set 12 are turned on or off so as to change inductance $L_2$ of the coil set 12, so that impedance $|Z_2|$ in the gas introduction pipe 1 is greater than impedance $|Z_1|$ in the reaction chamber 5.

Impedance $|Z_1|$ in the reaction chamber 5 is expressed as $|Z_1|=|(2\pi \cdot f)L_F-1/(2\pi \cdot f)C_F|$, and impedance $|Z_2|$ in the gas introduction pipe 1 is expressed as $|Z_2|=|(2\pi \cdot f)(1/(1/L+1/L_2))-1/(2\pi \cdot f)C|$. Inductance $L_2$ is adjusted so as to fulfill expression (3).

$$|(2\pi \cdot f)L_F-1/(2\pi \cdot f)C_F|<|(2\pi \cdot f)(1/(1/L+1/L_2))-1/(2\pi \cdot f)C| \quad (3)$$

Figure 8:
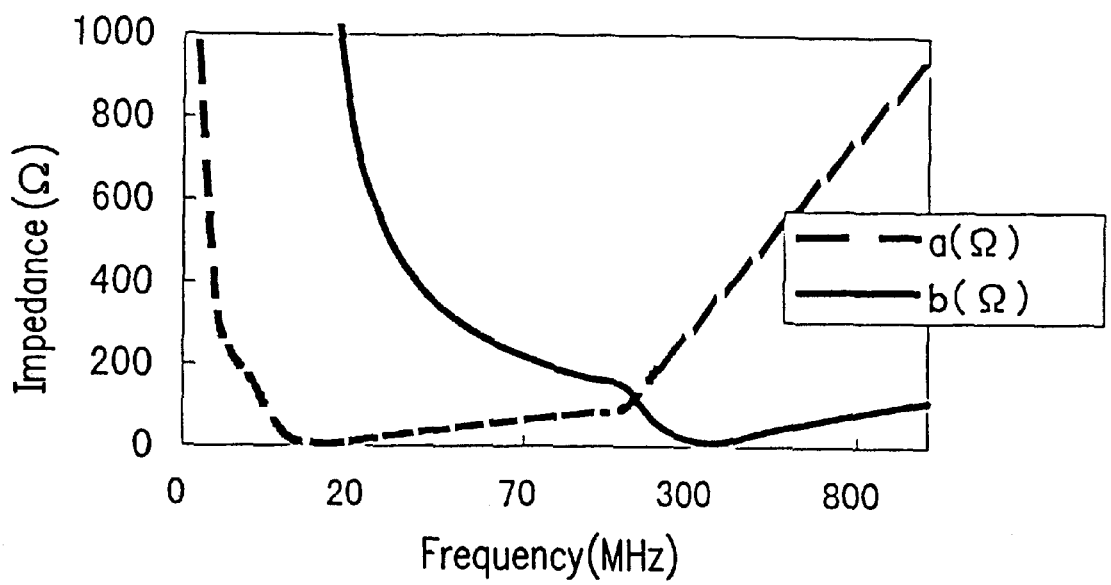
FIG. 8 is a graph illustrating impedances in a reaction chamber and a gas introduction pipe with respect to the frequency in the plasma CVD apparatus shown in FIG. 7.

More specifically, inductance $L_2$ is set to be, for example, 0.02 $\mu$H, so that impedance $|Z_2|$ in the gas introduction pipe 1 is greater than impedance $|Z_1|$ in the reaction chamber 5. The exciting frequency f for generating plasma is 81.36 MHz, which is in the VHF band. The values of $C_F$, $L_F$L and C in FIG. 8 are substituted into expression (3). As a result, impedance $|Z_2|$ in the gas introduction pipe 1 is 190 $\Omega$, whereas impedance $|Z_1|$ in the reaction chamber 5 is 70 $\Omega$. Thus, the plasma CVD apparatus 300 provides the same effect as that of the plasma CVD apparatuses 100 and 200 in the first and second examples.

EXAMPLE 4

In a fourth example according to the present invention, a plasma CVD apparatus 400 to which the present invention is applied will be described.

Figure 9:
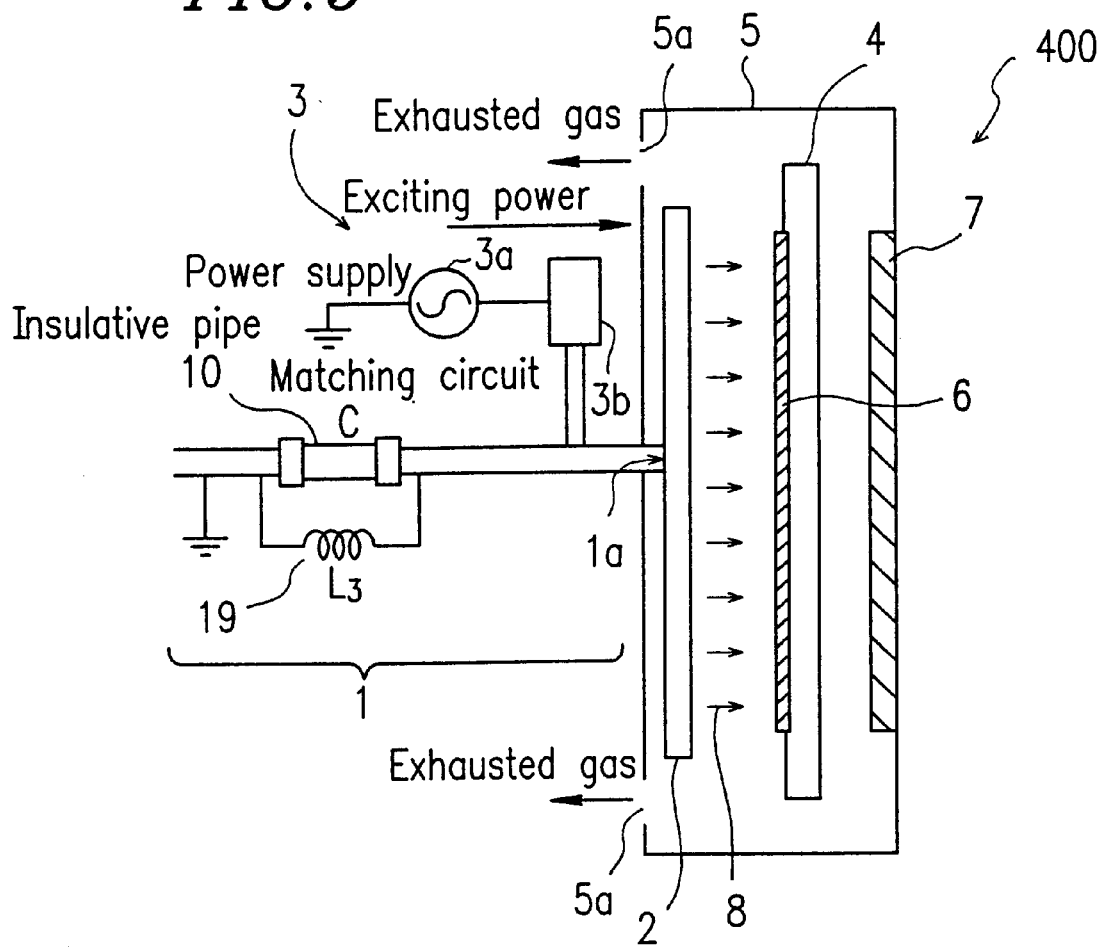
FIG. 9 is a schematic view of a plasma CVD apparatus in a fourth example according to the present invention.

As shown in FIG. 9, the plasma CVD apparatus 400 includes an insulative pipe 10 which is not variable in length and a coil 19 acting as an impedance adjusting device. The insulative pipe 10 and the coil 19 are connected in parallel. The coil 19 has inductance $L_3$. Except for these points, the plasma CVD apparatus 400 has the substantially the same structure as that of the plasma CVD apparatus 100 in the first example.

In the plasma CVD apparatus 400, the inductance $L_3$ of the coil 19 is adjusted, so that impedance $|Z_2|$ in the gas introduction pipe 1 is greater than impedance $|Z_1|$ in the reaction chamber 5.

Impedance $|Z_1|$ in the reaction chamber 5 is expressed as $|Z_1|=|(2\pi \cdot f)L_F-1/(2\pi \cdot f)C_F|$, and impedance $|Z_2|$ in the gas introduction pipe 1 is expressed as $|Z_2|=|1/((2\pi \cdot f)C-1/(2\pi \cdot f)L_3)|$. Capacitance C and inductance $L_3$ are schematically shown in FIG. 9. Inductance $L_3$ is adjusted so as to fulfill expression (4).

$$|(2\pi \cdot f)L_F-1/(2\pi \cdot f)C_F|<|1/((2\pi \cdot f)C-1/(2\pi \cdot f)L_3)| \quad (4)$$

Figure 10:
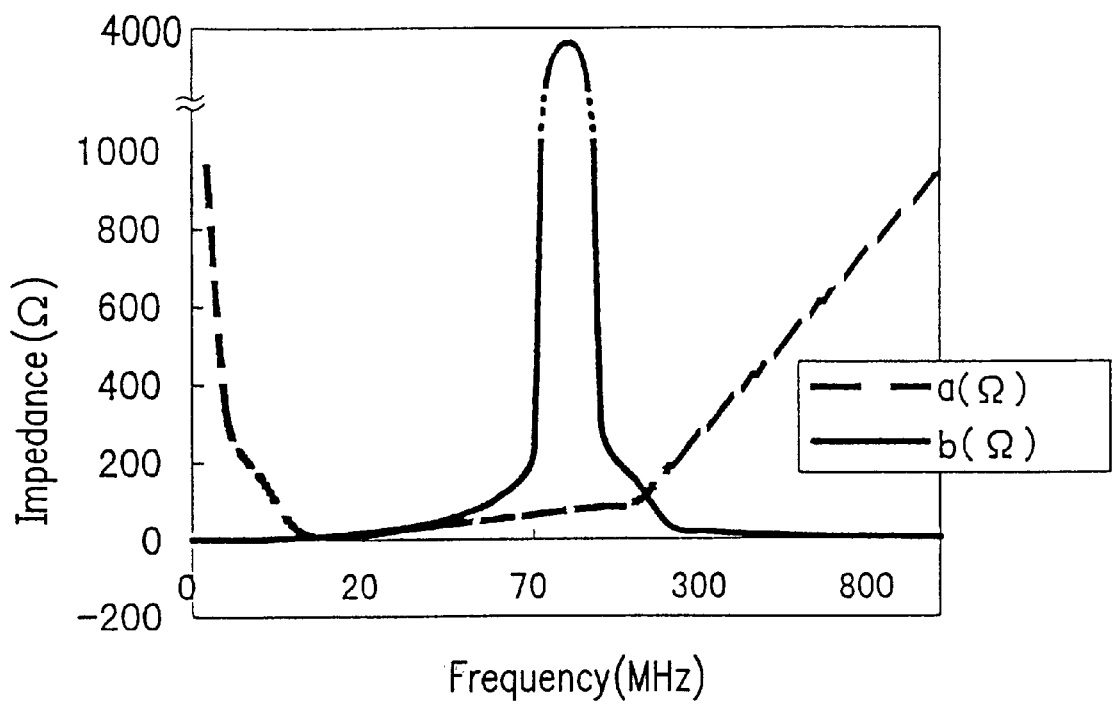
FIG. 10 is a graph illustrating impedances in a reaction chamber and a gas introduction pipe with respect to the frequency in the plasma CVD apparatus shown in FIG. 9.

More specifically, inductance $L_3$ is set to be, for example, about 0.13 $\mu$H, so that impedance $|Z_2|$ in the gas introduction pipe 1 is greater than impedance $|Z_1|$ in the reaction chamber 5. The exciting frequency f for generating plasma is 81.36 MHz, which is in the VHF band. The values of $C_F$, C and $L_F$ in FIG. 10 are substituted into expression (4). The equivalent impedance $L_F$ of the gas introduction pipe 1 is 0.2 $\mu$H. As a result, impedance $|Z_2|$ in the gas introduction pipe 1 is about 4 k$\Omega$, whereas impedance $|Z_1|$ in the reaction chamber 5 is as small as about 70 $\Omega$. Thus, the plasma CVD apparatus 400 provides the same effect as that of the plasma CVD apparatuses 100, 200 and 300 in the first, second and third examples.

EXAMPLE 5

In a fifth example according to the present invention, a plasma CVD apparatus 500 to which the present invention is applied will be described.

Figure 11:
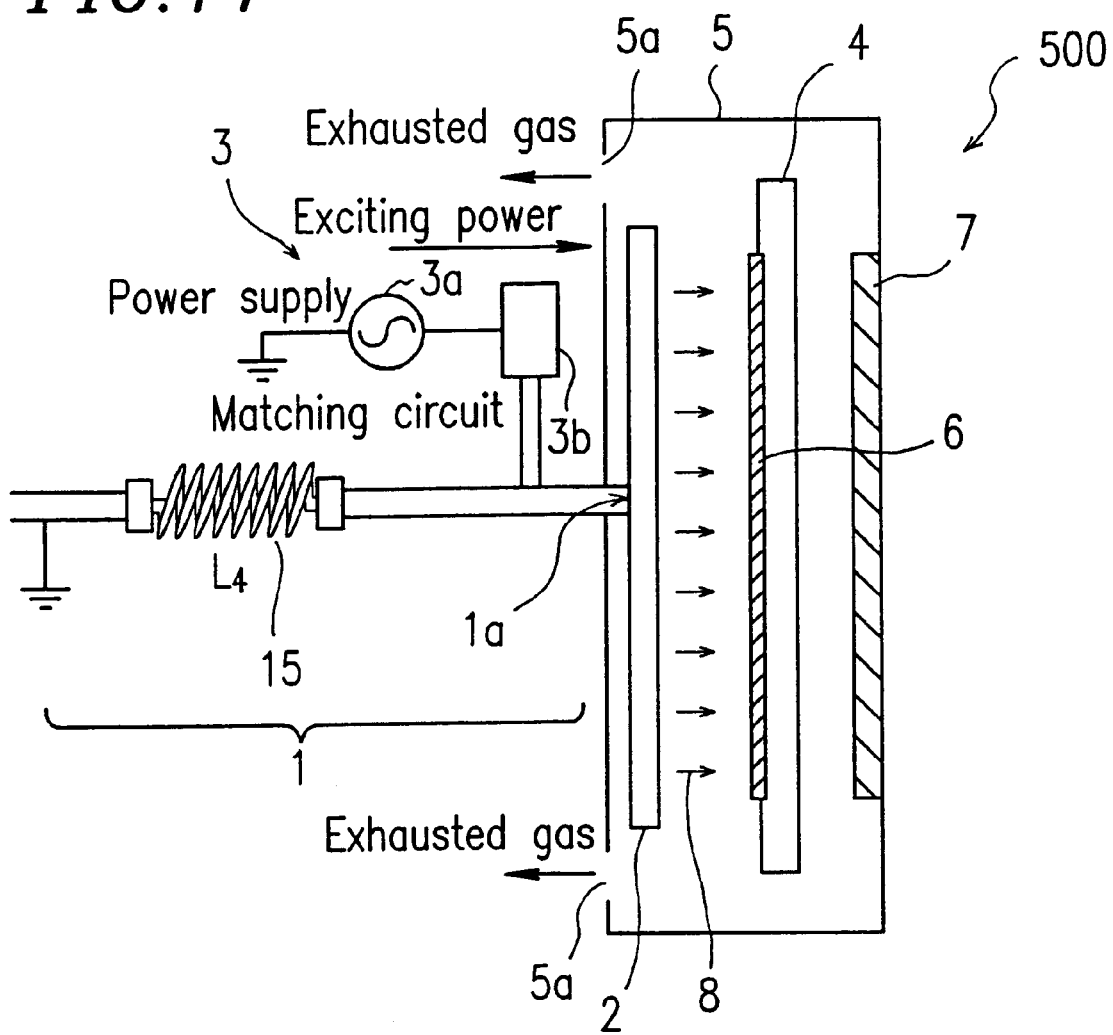
FIG. 11 is a schematic view of a plasma CVD apparatus in a fifth example according to the present invention.

As shown in FIG. 11, the plasma CVD apparatus 500 includes a coil 15 acting as an impedance adjusting device in an intermediate portion of the gas introduction pipe 1. There is no insulative pipe provided in the plasma CVD apparatus 500. The coil 15 is formed of stainless steel, and has a diameter of ¼ inch and a length of about 180 mm. The coil 15 has inductance $L_4$. Except for these points, the plasma CVD apparatus 500 has the substantially the same structure as that of the plasma CVD apparatus 100 in the first example.

In the plasma CVD apparatus 500, the inductance $L_4$ of the coil 15 is adjusted, so that impedance $|Z_2|$ in the gas introduction pipe 1 is greater than impedance $|Z_1|$ in the reaction chamber 5.

Impedance $|Z_1|$ in the reaction chamber 5 is expressed as $|Z_1|=|(2\pi \cdot f)L_F-1/(2\pi \cdot f)C_F|$, and impedance $|Z_2|$ in the gas introduction pipe 1 is expressed as $|Z_2|=|(2\pi \cdot f)(L+L_4)|$, where L is inductance of a portion of the gas introduction pipe other than the coil 15, the portion being provided at a position connected to the inductance $L_4$ in series between a position having the same potential as that of the cathode electrode 2 for a DC voltage and the position having the ground potential. Inductance $L_4$ is adjusted so as to fulfill expression (5).

$$|(2\pi \cdot f)L_F-1/(2\pi \cdot f)\ C_F|<|(2\pi \cdot f)(L+L_4)| \quad (5)$$

Figure 12:
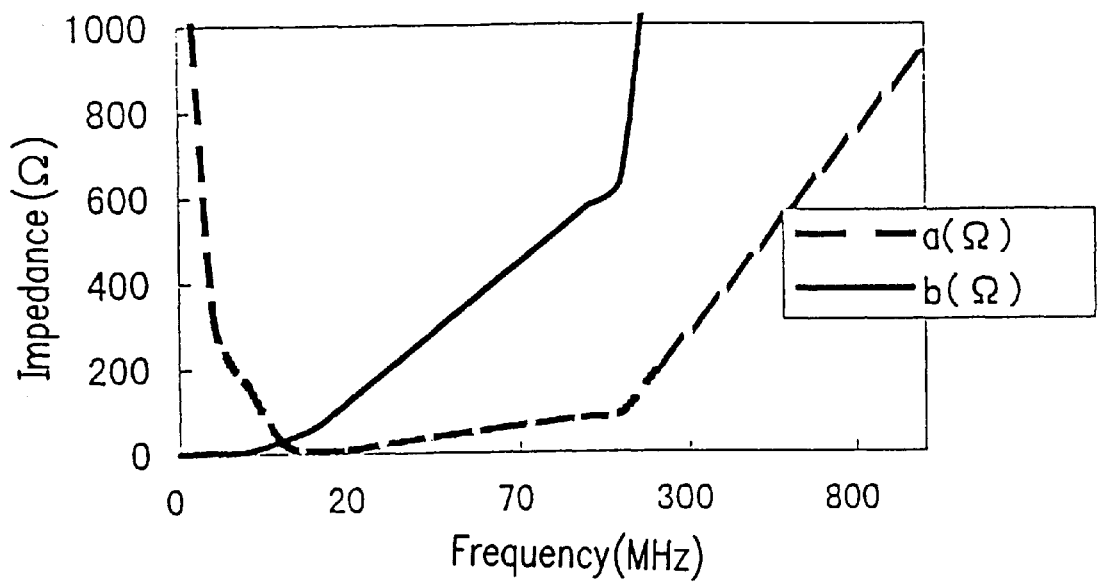
FIG. 12 is a graph illustrating impedances in a reaction chamber and a gas introduction pipe with respect to the frequency in the plasma CVD apparatus shown in FIG. 11.

More specifically, inductance $L_4$ is set to be, for example, about 1.0 $\mu$H, so that impedance $|Z_2|$ in the gas introduction pipe 1 is greater than impedance |Z₁| in the reaction chamber 5. Inductance L of the rest of the gas introduction pipe 1 is about 0.2 μH. The exciting frequency f is 81.36 MHz, which is in the VHF band. The values of $L_F$ and $C_F$ in FIG. 12 are substituted into expression (5). As a result, impedance |Z₂| in the gas introduction pipe 1 is several hundred ohms, whereas impedance |Z₁| in the reaction chamber 5 is as small as about 80 Ω. Thus, the plasma CVD apparatus 500 provides the same effect as that of the plasma CVD apparatuses 100 through 400 in the first through fourth examples.

EXAMPLE 6

In a sixth example according to the present invention, a plasma CVD apparatus 600 to which the present invention is applied will be described.

Figure 13:
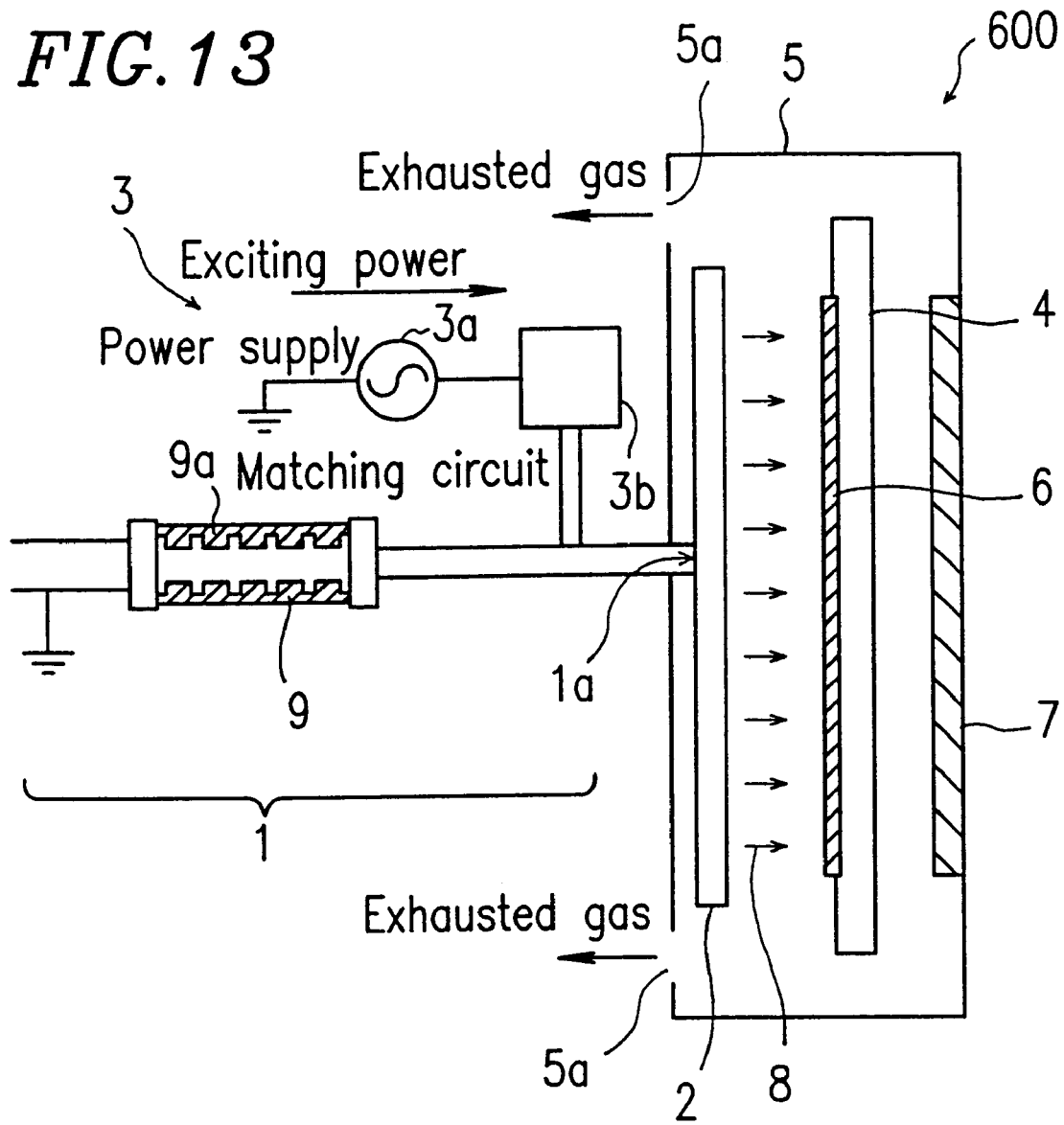
FIG. 13 is a schematic view of a plasma CVD apparatus in a sixth example according to the present invention.

As shown in FIG. 13, the plasma CVD apparatus 600 includes an insulative pipe 9 in an intermediate portion of the gas introduction pipe 1. The insulative pipe 9 has a groove structure 9a on an inner surface thereof and acts as an impedance adjusting device. The local capacitance in the insulative pipe 9 is increased by the groove structure 9a and thus the resonance frequency of the insulative pipe 9 is decreased. Thus, the amount of power supplied from the high frequency power generation device 3 is reduced. The power used for generating plasma in the reaction chamber 5 is increased by such a decrease. Accordingly, plasma is generated in the reaction chamber 5 without fail. Except for these points, the plasma CVD apparatus 600 has the substantially the same structure as that of the plasma CVD apparatus 100 in the first example.

Exemplary dimensions of the insulative pipe 9 are as follows. The insulative pipe 9 includes a cylindrical tube having a length of about 15 cm and a diameter of about 5 cm. The groove structure 9a is formed of dielectrics such as polytetrafluoroethylene (e.g., Teflon®) having a dielectric constant of about 3.0 or alumina having a dielectric constant of about 8.5 and is provided on an inner surface of the cylindrical tube. The groove structure 9a has striped projections having a height of about 5 to 10 mm and arranged at a pitch of about 12 mm.

Needless to say, one or more of the impedance adjusting devices described in the first through sixth examples can be used in combination.

Other impedance adjusting devices usable for the present invention include a pressure adjusting device for adjusting a pressure of the reaction gas flowing in the gas introduction pipe and a flow rate adjusting device.

In the first through sixth examples, the present invention is applied to a plasma CVD apparatus. The present invention is also applicable to an etching apparatus which uses, for example, CF₄ or NF₃ as reaction gas.

According to the present invention, an electronic device fabrication apparatus including an impedance adjusting device is provided in a gas introduction pipe. The impedance adjusting device allows the impedance in the gas introduction pipe to be adjusted to be greater than the impedance in the reaction chamber. Therefore, even when high frequency power having an exciting frequency in the VHF band or UHF band higher than the RF band is introduced from a high frequency power supply, plasma is generated in a reaction space between the cathode electrode and the anode electrode as desired.

Accordingly, an electronic device fabrication apparatus according to the present invention provides high quality film formation or etching over a large area between the cathode electrode and the anode electrode at a high efficiency.

Such an electronic device fabrication apparatus according to the present invention realizes improved throughput and is usable as a plasma CVD apparatus for producing, for example, semiconductor thin films or insulative films or a plasma etching apparatus used in the process of fabricating, for example, semiconductor devices or liquid crystal display devices.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. An electronic device fabrication apparatus, comprising:
   a reaction chamber;
   a cathode electrode and an anode electrode opposed to each other in the reaction chamber;
   a gas introduction pipe introduced into the reaction chamber for supplying reaction gas into the reaction chamber, the gas introduction pipe being electrically connected to the cathode electrode; and
   a high frequency power generation device for applying a high frequency voltage having a high exciting frequency which is included in one of a VHF band and a UHF band to the cathode electrode through the gas introduction pipe for exciting the reaction gas into a plasma state,
   wherein the gas introduction pipe includes an impedance adjusting device for adjusting an impedance of the gas introduction pipe.

2. An electronic device fabrication apparatus according to claim 1, wherein the impedance adjusting device adjusts the impedance of the gas introduction pipe to be higher than an impedance of the reaction chamber.

3. An electronic device fabrication apparatus according to claim 1, wherein the impedance adjusting device includes an insulative pipe having an adjustable length which is provided in an intermediate portion of the gas introduction pipe as a part of the gas introduction pipe, and a capacitance C which is variable by adjusting the length of the insulative pipe is an impedance adjusting capacitance $C_1$.

4. An electronic device fabrication apparatus according to claim 3, wherein the impedance adjusting capacitance $C_1$ fulfills expression (1):

$$|(2\pi f)L_F - 1/(2\pi f)C_F| < |(2\pi f)L - 1/(2\pi f)C_1| \qquad (1)$$

where:
   π: ratio of the circumference of the circle to the diameter,
   f: exciting frequency,
   $L_F$: inductance at a position which is electrically connected in series to a portion having the same potential as that of the cathode electrode for a DC voltage,
   $C_F$: capacitance between a portion having the same potential as that of the cathode electrode for a DC voltage and a portion having a ground potential, and
   L: inductance at a position which is electrically connected in series to the insulative pipe in the gas introduction pipe.

5. An electronic device fabrication apparatus according to claim 1, wherein the gas introduction pipe has an insulative pipe in an intermediate portion thereof, the impedance adjusting device includes another portion provided in the gas introduction pipe in serial connection with the insulative pipe, and the another portion has an adjustable length and has an impedance adjusting inductance $L_1$.

6. An electronic device fabrication apparatus according to claim 5, wherein the inductance impedance adjusting inductance $L_1$ fulfills expression (2):

$$|(2\pi f)L_F - 1/(2\pi f)C_F| < |(2\pi f)L_1 - 1/(2\pi f)C| \qquad (2)$$

where:
- $\pi$: ratio of the circumference of the circle to the diameter,
- f: exciting frequency,
- $L_F$: inductance at a position which is electrically connected in series to a portion having the same potential as that of the cathode electrode for a DC voltage,
- $C_F$: capacitance between a portion having the same potential as that of the cathode electrode for a DC voltage and a portion having a ground potential, and
- C: capacitance between the insulative pipe and the portion having the ground potential.

7. An electronic device fabrication apparatus according to claim 1, wherein the gas introduction pipe has an insulative pipe in an intermediate portion thereof, the impedance adjusting device includes another portion provided in the gas introduction pipe in serial connection with the insulative pipe, and the another portion has an impedance adjusting inductance $L_2$ and connected in parallel to the gas introduction pipe.

8. An electronic device fabrication apparatus according to claim 7, wherein the inductance impedance adjusting inductance $L_2$ fulfills expression (3):

$$|(2\pi f)L_F - 1/(2\pi f)C_F| < |(2\pi f)(1/(1/L + 1/L_2)) - 1/(2\pi f)C| \qquad (3)$$

where:
- $\pi$: ratio of the circumference of the circle to the diameter,
- f: exciting frequency,
- $L_F$: inductance at a position which is electrically connected in series to a portion having the same potential as that of the cathode electrode for a DC voltage,
- $C_F$: capacitance between a portion having the same potential as that of the cathode electrode for a DC voltage and a portion having a ground potential,
- L: inductance at a position which is electrically connected in series to the insulative pipe in the gas introduction pipe, and
- C: capacitance between the insulative pipe and the portion having the ground potential.

9. An electronic device fabrication apparatus according to claim 1, wherein the gas introduction pipe has an insulative pipe in an intermediate portion thereof, and the impedance adjusting device includes a groove structure provided on an inner surface of the insulative pipe.

10. An electronic device fabrication apparatus according to claim 1, wherein the gas introduction pipe has an insulative pipe in an intermediate portion thereof, and the impedance adjusting device includes another portion having an inductance $L_3$ which is connected to the insulative pipe in parallel.

11. An electronic device fabrication apparatus according to claim 10, wherein the inductance impedance adjusting inductance $L_3$ fulfills expression (4):

$$|(2\pi f)L_F - 1/(2\pi f)C_F| < |1/((2\pi f)C - 1/(2\pi f)L_3)| \qquad (4)$$

where:
- $\pi$: ratio of the circumference of the circle to the diameter,
- f: exciting frequency,
- $L_F$: inductance at a position which is electrically connected in series to a portion having the same potential as that of the cathode electrode for a DC voltage,
- $C_F$: capacitance between a portion having the same potential as that of the cathode electrode for a DC voltage and a portion having a ground potential, and
- C: capacitance between the insulative pipe and the portion having the ground potential.

12. An electronic device fabrication apparatus according to claim 1, wherein the impedance adjusting device includes a coil having an inductance $L_4$ provided in an intermediate portion of the gas introduction pipe.

13. An electronic device fabrication apparatus according to claim 12, wherein the inductance impedance adjusting inductance $L_4$ fulfills expression (5):

$$|(2\pi f)L_F - 1/(2\pi f)C_F| < |(2\pi f)(L + L_4)| \qquad (5)$$

where:
- $\pi$: ratio of the circumference of the circle to the diameter,
- f: exciting frequency,
- $L_F$: inductance at a position which is electrically connected in series to a portion having the same potential as that of the cathode electrode for a DC voltage,
- $C_F$: capacitance between a portion having the same potential as that of the cathode electrode for a DC voltage and a portion having a ground potential, and
- L: inductance of a portion of the gas introduction pipe other than the coil, the portion being provided at a position connected to the coil having an inductance $L_4$ in series between a position having the same potential as that of the cathode electrode for a DC voltage and the position having the ground potential.

* * * * *